United States Patent [19]
Wilenken et al.

[11] Patent Number: 5,666,082
[45] Date of Patent: Sep. 9, 1997

[54] FAULT PROTECTION USING PARALLEL OUTPUT CMOS DEVICES FOR INTEGRATED CIRCUIT ANALOG SWITCHES

[75] Inventors: Richard Wilenken, Etna; Pirooz Parvarandeh, Los Altos; Terry Martin, San Jose, all of Calif.

[73] Assignee: Maxim Integrated Products, Inc., Sunnyvale, Calif.

[21] Appl. No.: 582,423

[22] Filed: Dec. 29, 1995

[51] Int. Cl.$^6$ ............................................. H03K 17/62
[52] U.S. Cl. ............................ 327/404; 327/427; 327/379
[58] Field of Search ................................ 307/112, 113, 307/132 E, 132 M, 139, 141.8; 326/14, 113; 327/170, 365, 374, 379, 389, 392, 403, 404, 427, 436

Primary Examiner—Timothy P. Callahan
Assistant Examiner—Jeffrey Zweizig
Attorney, Agent, or Firm—Blakely, Sokoloff, Taylor & Zafman LLP

[57] ABSTRACT

Fault protection using parallel output CMOS devices for integrated circuit analog switches prevents damage to circuits incorporating the same by not coupling analog input voltages beyond the power supply voltages to the analog output, and by preventing the forward biasing of any P/N junction to provide a low impedance path between such fault analog input voltage and either power supply terminal. Circuitry is provided for having the analog output electrically floating whenever the switch is commanded off, regardless of whether the analog input is within the power supply voltage range or not, to provide the analog input as the analog output whenever the switch is commanded on and the analog input is within the power supply voltage range, and to clamp the analog output at the closest power supply voltage whenever the switch is commanded on and the analog input is beyond the power supply voltage range. Alternate embodiments are disclosed.

23 Claims, 7 Drawing Sheets

FIG. 3A  SWITCH ON

FIG. 3B  SWITCH OFF

FIG. 4A  POSITIVE FAULT

FIG. 4B  NEGATIVE FAULT

FAULT PROTECTION USING PARALLEL OUTPUT CMOS DEVICES FOR INTEGRATED CIRCUIT ANALOG SWITCHES

BACKGROUND OF THE INVENTION

1. Field of the Invention

The present invention relates to the field of fault detection, and more particularly to fault detection and protection of analog switches and devices incorporating analog switches, such as by way of example, multiplexers and the like.

2. Prior Art

Figure 1:
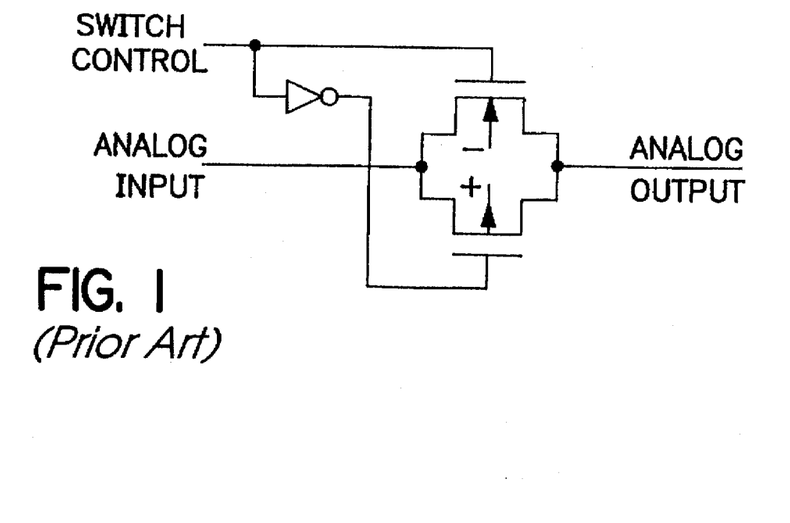
FIG. 1 illustrates the parallel connection of an N-channel MOSFET and a P-channel MOSFET to form an analog switch.

Integrated circuit analog switches, derived from CMOS technology, have been well known for many years. As shown in FIG. 1, such switches are generally characterized by a P-channel enhancement mode device and an N-channel enhancement mode device connected in parallel and having their gates driven by a digital (two state) control signal and its complement, respectively. This arrangement of complementary devices and complementary drive turns the devices on and off in unison, and when on, couples the input to the switch to the output of the switch through a low impedance, regardless of the analog level of the input. In particular, the complementary devices and complementary drive provides a symmetry assuring that when the switch is on, one device is firmly on regardless of which power supply rail the input and output signals may be approaching. Such an arrangement of devices and drive is the prevalent way switches are made today.

CMOS switches can be made using a variety of process technologies (i.e., dielectric isolation, trench isolation, and standard junction isolation). While each process has its own advantages and disadvantages, a universal problem is what happens to the final switch product under fault conditions. This has a major reliability effect on a customer's system, as it is highly preferable that a fault will cause no more than a temporary malfunction recoverable when the fault disappears or is corrected, rather than a catastrophic failure requiring parts or subsystem replacement before the board or system is operative again.

Normal operation of CMOS analog switches is limited to the power supplies applied to the part or lower, depending upon the individual device sold. For example, with plus and minus 15 v power supplies, many analog switches can handle input signals up to plus and minus 15 v. As long as users stay within the power supply range, the parts perform to the data sheets describing the parts. However, if input signals exceed the power supplies (fault condition), or the power supplies are inadvertently turned off while signals are present (fault condition), the part may be destroyed because of the forward biasing, from a relatively low impedance source, of the diodes formed between diffused regions and the substrate or wells in the substrate which are connected to one or the other power supply connections. Even if the switch is not destroyed, it may conduct the fault condition to its output and the device connected to the output may be damaged. For these reasons, manufacturers often warn against allowing this condition to occur.

Either fault condition can not only destroy the analog switch, but can also destroy the circuitry following the switch. While nobody plans on these faults occurring in a system, they do with enough frequency to make it a substantial reliability problem. Junction isolated CMOS switches are the predominant type sold today and most exhibit a sequencing problem during normal testing. This sequencing problem is really related to one of the fault conditions listed above, namely one of the power supplies being off while signals are present. In a typical N-substrate, junction-isolated, CMOS switch, the substrate must be taken to the most positive voltage in the circuit, and this is normally taken to the positive power supply voltage (i.e., +15 v for plus and minus 15 v supply systems). Any P-diffusion made into this substrate must have voltages no higher than the positive supply value, or device damage can occur. The mechanism for this is the P/N junction formed by the P diffusion into the N-substrate. This forms a diode with the cathode of the diode being the N material, and the anode of the diode being the P diffusion. This junction will be forward-biased whenever the anode terminal is about 0.6 v or higher with respect to the cathode terminal. Now with the N-substrate at plus 15 v, the P diffusion voltage can be no higher than 15 v+0.6 v=15.6 v, or alternately, if the normal 15 v supply is off (and thus is at Ground potential, or 0 v), then the P diffusion voltage can be no higher than 0 v+0.6 v=0.6 v.

For normal operation, such switches can handle any signal within the power supply range with no damage to the switches. If a sequence occurs that has a 0.6 v or more signal applied while the positive supply has not yet been applied, a fault condition is present, and damage will probably be the result. Switches can be damaged if the positive and/or negative supply turn-ons lag the signal turn-on by as little as microseconds. Thus, any test equipment setup must turn on the most positive supply first, and then the remaining voltages can be applied. While a controlled test environment can be programmed this way, field use of equipment has been a more difficult problem.

A similar situation occurs when N-channels are made by diffusing a P-well into the N-substrate, and subsequent N diffusions are made into the P-well. If the P-well (body of the N-channel) is taken to the most negative voltage, which is common, then the source or drain (N diffusions into the P-well) must never be more negative than 0.6 v relative to the P-well voltage. For a plus and minus 15 v supply system, this means the N-channel body would go to $-15$ v, and the source or drain cannot go less than $-15.6$ v or damage probably will result. As in the 15 v case just described, if the $-15$ v power supply inadvertently goes off while negative signals are present at the source or drain of an N-channel device, these negative signals must be below $-0.6$ v or so, or damage can result. In this case, the diode is formed by the N diffusion in the P-well.

There is a partial solution to the fault conditions already existing in the industry; that is to use a serial configuration of N-channel, P-channel, N-channel devices. Indeed, this will prevent any of the described faults from destroying devices. However this scheme has the disadvantage of not handling signals up to the supply values (switching them through), as this will only switch signals less than the supply values by virtue of the thresholds of the individual N and P channel devices (i.e., for typical 1.5 v thresholds for either N or P channel devices, only 15 v−1.5 v=13.5 v can be switched through the circuits). This is a disadvantage to some users of the switches. Also, the chip area used to assure that the "on" resistance for the switch is below a guaranteed maximum value using a series configuration is much greater than that used to make a parallel combination of an N and P channel. This has a large impact on final chip size, and the selling price of the part.

Until now, the best solution for fault protection has been the use of the series N,P,N channel structures, while the most economical circuits have used parallel N and P channel structures, but these have suffered with the fault conditions described.

BRIEF SUMMARY OF THE INVENTION

Fault protection using parallel output CMOS devices for integrated circuit analog switches prevents damage to circuits incorporating the same by not coupling analog input voltages beyond the power supply voltages to the analog output, and by preventing the forward biasing of any P/N junction to provide a low impedance path between such fault analog input voltage and either power supply terminal. Circuitry is provided for having the analog output electrically floating whenever the switch is commanded off, regardless of whether the analog input is within the power supply voltage range or not, to provide the analog input as the analog output whenever the switch is commanded on and the analog input is within the power supply voltage range, and to clamp the analog output at the closest power supply voltage whenever the switch is commanded on and the analog input is beyond the power supply voltage range. Alternate embodiments are disclosed.

DETAILED DESCRIPTION OF THE INVENTION

The present invention combines the fault protection features of the prior art series configuration and the economy features of the prior art parallel configuration into a new, parallel output fault-protected design. A key feature of this design is the use of the fault voltage itself to shut off the switch, so no fault signals can be conducted through the switch, nor can they damage the switch. Another feature of the preferred embodiment of the invention is the clamping of the output of the circuit at the most positive or the most negative power supply voltage dependent on whether the input fault voltage is above the most positive or below the most negative power supply voltage, thereby preserving the polarity of the output of the circuit in the event the direction of the fault condition is indicative of the desired output of the circuit.

Figure 2:
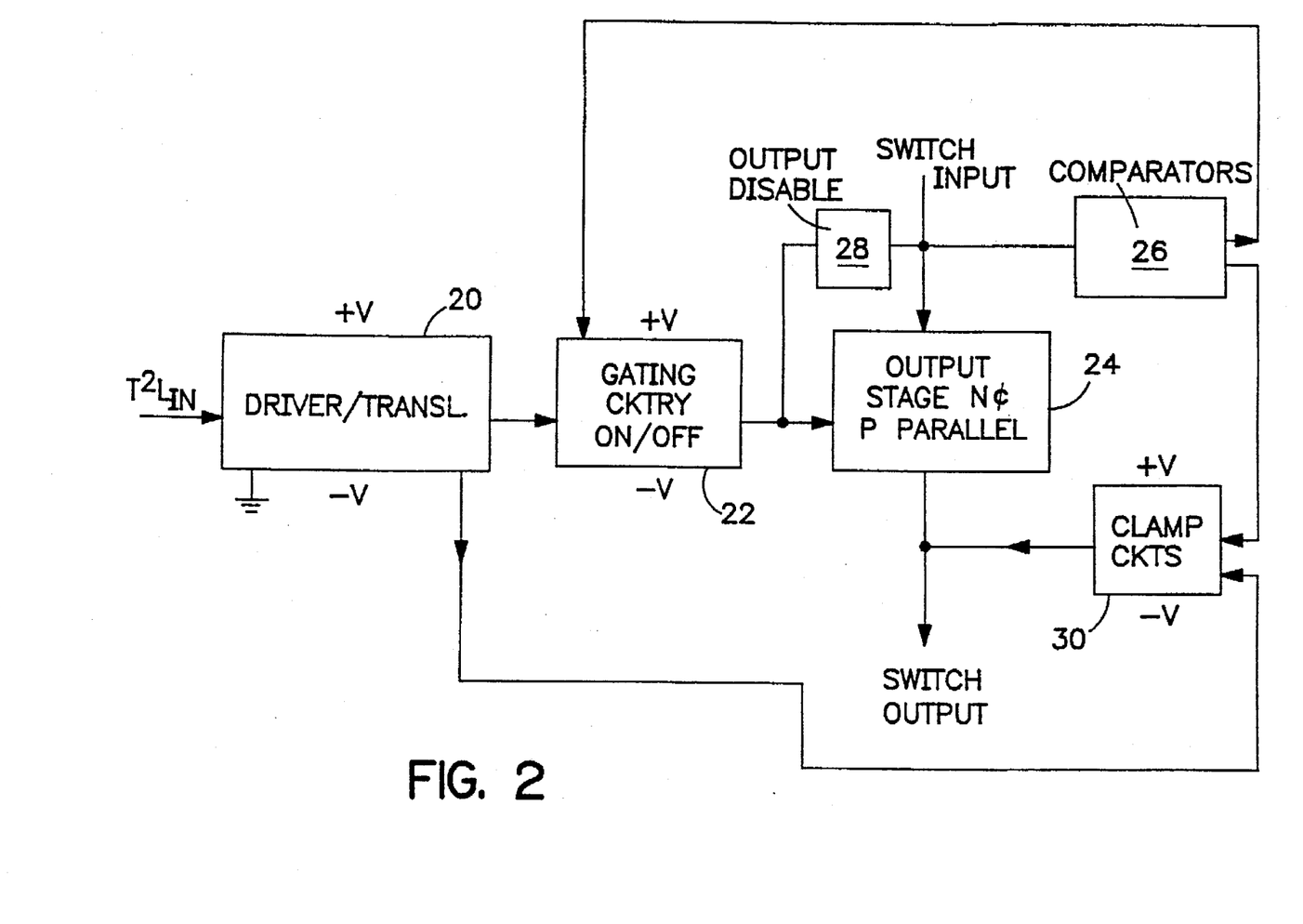
FIG. 2 is a block diagram of the circuit used in a preferred embodiment of the invention.

FIG. 2 is a block diagram of the circuit used in a preferred embodiment of the invention. The block diagram shows a typical analog switch in accordance with the present invention whose state is controlled by a digital input signal ($T^2L$ input). Power is supplied to the circuit through supplies $-V$ and $+V$ to enable switching within the supply constraints.

The driver/translator 20 receives the input digital command ($T^2L$ input) and translates the $T^2L$ levels to CMOS levels referenced to the plus and minus power supplies. The output of the driver/translator is either plus or minus V, depending upon the digital level. Typical logic levels used are in the 0 v to 5 v range, and typical plus and minus V range from plus and minus 3 v to plus and minus 20 v. Also, single supply operation is performed by making $-V$ ground (Gnd) voltage.

The gating circuitry 22 coupled to the driver/translator 20 will pass the driver/translator levels through to the output stage 24 if the switch sees only normal inputs within its supply levels, whereupon the output stage responds to the input $T^2L$ command. The gating circuitry 22 receives the plus and minus V levels of the driver/translator 20 and outputs these same levels to the output stage when no fault condition is present. If any type of fault occurs however, the comparators 26 generate a signal to tell the gating circuitry 22 to shut off the switch, in which case the output of the gating circuit 22 will turn off both the N and P-channel devices of the output stage 24. In that regard, note that it is not required to turn off both the N-channel and P-channel devices when a fault condition occurs. For example, with a positive fault, it is necessary to shut off the P-channel device, but the N-channel device will not conduct the fault voltage to the analog output even if its gate is at the positive power supply voltage. Similarly, it is necessary to shut off the N-channel device, but the P-channel device will not conduct the fault voltage to the analog output even if its gate is at the negative power supply voltage.

The output stage consists of an N-channel MOSFET in parallel with a P-channel MOSFET, as in FIG. 1. Thus their sources and drains are connected together, with the common source side being the analog input (switch input) while the common drain side is the switch output. These devices are enhancement mode MOSFETS, so that these devices are turned on when the gate voltage exceeds the source voltage by the threshold voltage of the devices. When the gate to source voltage equals or exceeds this threshold voltage, the N or P device is in an "on" state, and when the gate to source voltage is 0 v or less, the MOSFETS are in an "off" state. The "on" state means that the switch conducts the switch input to the switch output, and the "off" state means there is no conduction of input to output.

The output disable circuit 28 senses the switch input and does nothing if the input is within the bounds of the power supply voltages. On the other hand, if the switch input is outside the supply voltage range (fault condition), then the output disable circuit 28 generates a Vgs≈0 v for either the output N or P channel device, depending upon whether the fault voltage is higher than +V or lower than −V (Vgs is the gate-source voltage of the respective device). For example, if the fault voltage is more positive than +V, a Vgs≈0 v is generated for the P channel device of the switch. The N channel device gate-source voltage is considerably less than the threshold voltage so it is off at this time anyway. When a fault voltage is more negative than −V, a Vgs≈0 v is generated for the N channel device of the switch, the P channel device being off at this time because its gate to source voltage is below its threshold value. (While circuit 28 of the preferred embodiment generates a Vgs that is approximately 0 v, it is possible to rig the circuit so that a non-zero Vgs, but one that is lower than VT, will also work. Even a Vgs that is approximately equal to VT will work if the currents that are conducted can be limited to low values.)

Figure 3A:
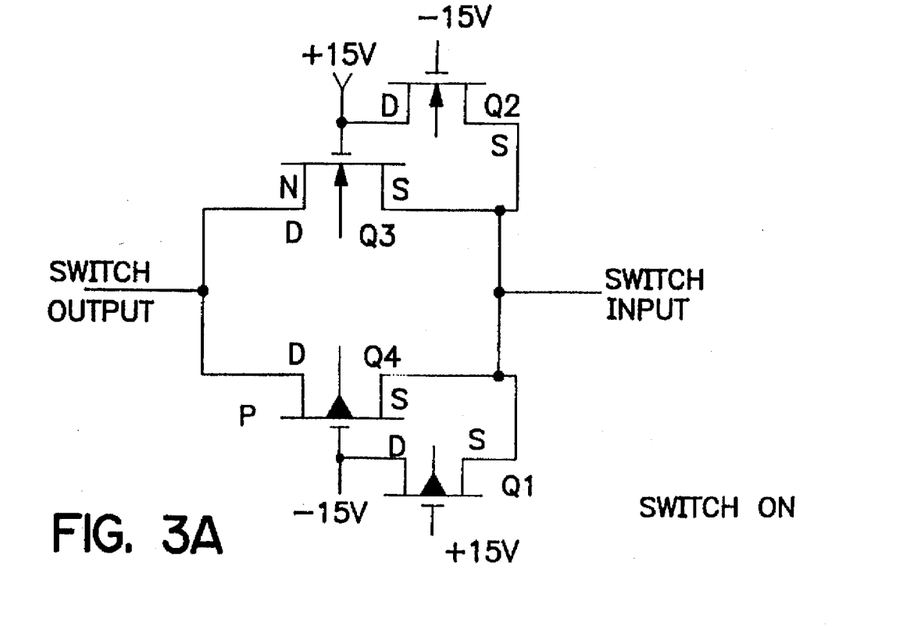
FIGS. 3a and 3b are circuit diagrams of the main portion of the output stage in the switch on and switch off condition.
Figure 3B:
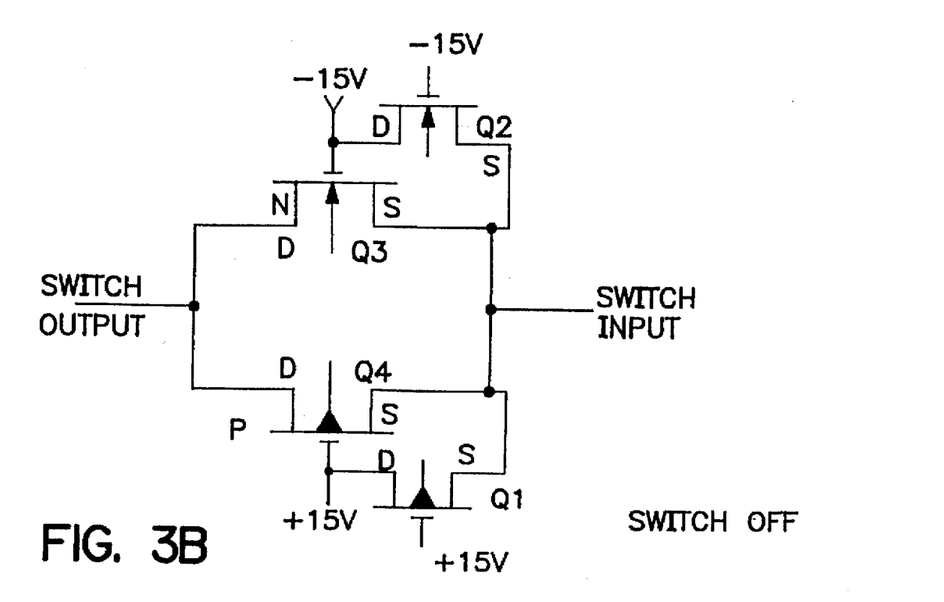
Figure 4A:
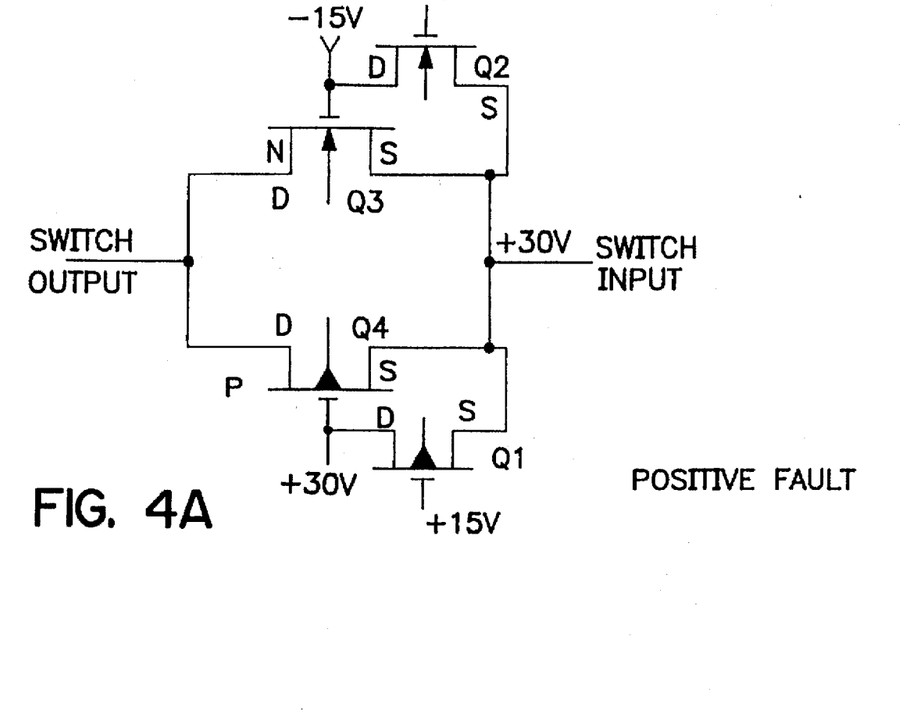
FIGS. 4a and 4b are circuit diagrams of the main portion of the output stage 24 illustrating plus and minus fault conditions.
Figure 4B:
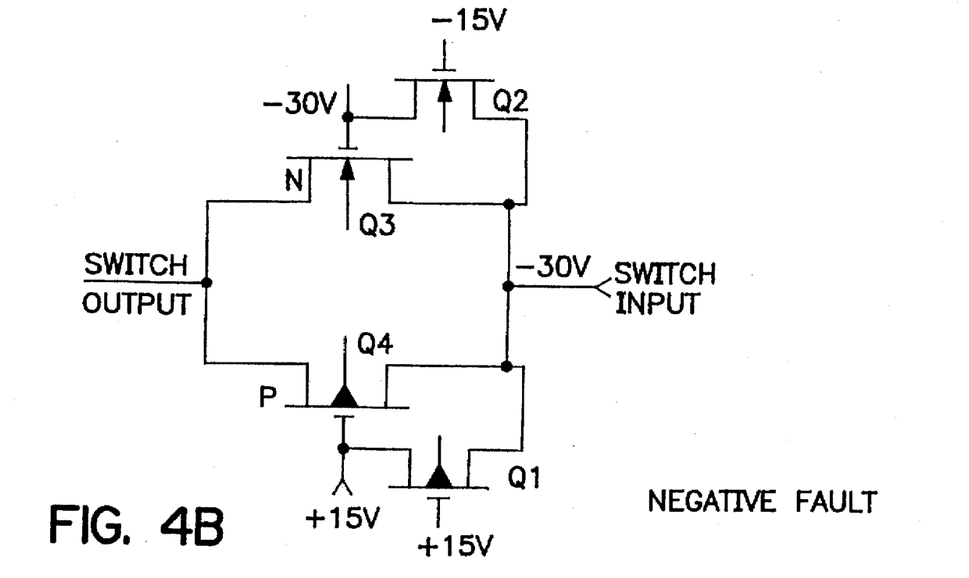

The foregoing is illustrated in FIGS. 3a and 3b, which are circuit diagrams of the main portion of the output stage in the switch on and switch off condition, and FIGS. 4a and 4b, which are circuit diagrams of the main portion of the output stage 24 illustrating plus and minus fault conditions. As shown in FIG. 3a, the analog switch is comprised of N-channel device Q3 and P-channel device Q4 connected in parallel. When the switch is on, the gate of N-channel device Q3 is coupled to the positive power supply voltage (+15 volts in this example), and the gate of P-channel device Q4 is coupled to the negative power supply voltage (−15 volts in this example). In addition to these two devices, N-channel device Q2 has its source coupled to the switch input and its drain coupled to the gate of N-channel device Q3, the gate of N-channel device Q2 being coupled to the negative power supply voltage −15 volts. Similarly, P-channel device Q1 has its source coupled to the switch input and its drain coupled to the gate of P-channel device Q4, the gate of P-channel device Q1 being coupled to the positive power supply voltage +15 volts. With this connection, so long as the switch input voltage levels remain within the range of the two power supply voltages, Q1 and Q2 will both remain off, as the gate source voltages of devices Q1 and Q2 will both be opposite to those required to turn either device on. The same is true for FIG. 3b when the switch is off, the gate source voltages of devices Q1 and Q2 both being opposite to those required to turn either device on.

In FIG. 4a, a +30 v fault voltage has been applied to the switch input (this represents a fault because the supply voltages are only +15 v and −15 v). Thus, Q1 sees a Vgs=15 v−30 v=−15 v, so Q1 is turned on and the +30 v at its source is coupled to its drain. This means that the source and gate of Q4 (P device) are both at +30 v, so Q4 Vgs=0 v and Q4 is in an "off" state. The +30 v fault is coupled to the comparators 26 (FIG. 2) and one of the comparators controls the gating circuitry to shut off device Q3 of the switch by coupling a −15 v signal to the gate of Q3. Q3 is not enhanced, so is in an "off" state, as is Q4, so the switch is not conducting and the +30 v fault is not coupled to the switch output. Furthermore, there is no path for any appreciable current for the fault signal (only leakage current) so no power is dissipated to destroy any part of the chip.

FIG. 4b shows the comparable case for a −30 v fault applied to the switch. Now Q2 will be enhanced (turned on), so −30 v will appear at the gate of Q3. Q3 now has a Vgs=0 v and is "off." Simultaneously, the fault sends a signal to the comparators 26 (FIG. 2), and a comparator produces a signal which causes the gating circuitry to turn Q4 of the switch off by forcing the gate of Q4 to +15 v . Q4 is not enhanced, and Q3 is not enhanced, so the −30 v is not conducted through the switch. Again, there is no appreciable current path for the −30 v (leakage again), so power dissipation is minimal and the chip is not damaged.

The comparator circuits are two separate voltage comparators. One is referenced to +V, and the other to −V. Each comparator compares the switch input to its reference voltage, and when the switch input is higher than the reference voltage, the comparator output sends a signal to the gating circuitry to turn the switch "off." At the same time, the comparator circuit couples a signal to clamp circuit 30 to clamp the switch output to +V for a positive overvoltage fault, and to −V for a negative overvoltage fault.

The clamp circuit's function is to clamp the switch output to a power supply rail if the T²L input signal is such as to normally cause the switch to be "on," or in a closed state. It will clamp the output to +V for positive overvoltages, and to −V for negative overvoltages. The clamp circuit consists of a NOR gate driving an N-channel to clamp the negative side; a NAND gate driving a P-channel to clamp the positive side. The gates are two input gates (comparator output and driver/translator output) which allows the clamp to only work if the switch is normally on. When the T²L signal is such as to normally turn the switch off, the clamp circuit cannot function, and in this case the switch output will electrically float.

Figure 5:
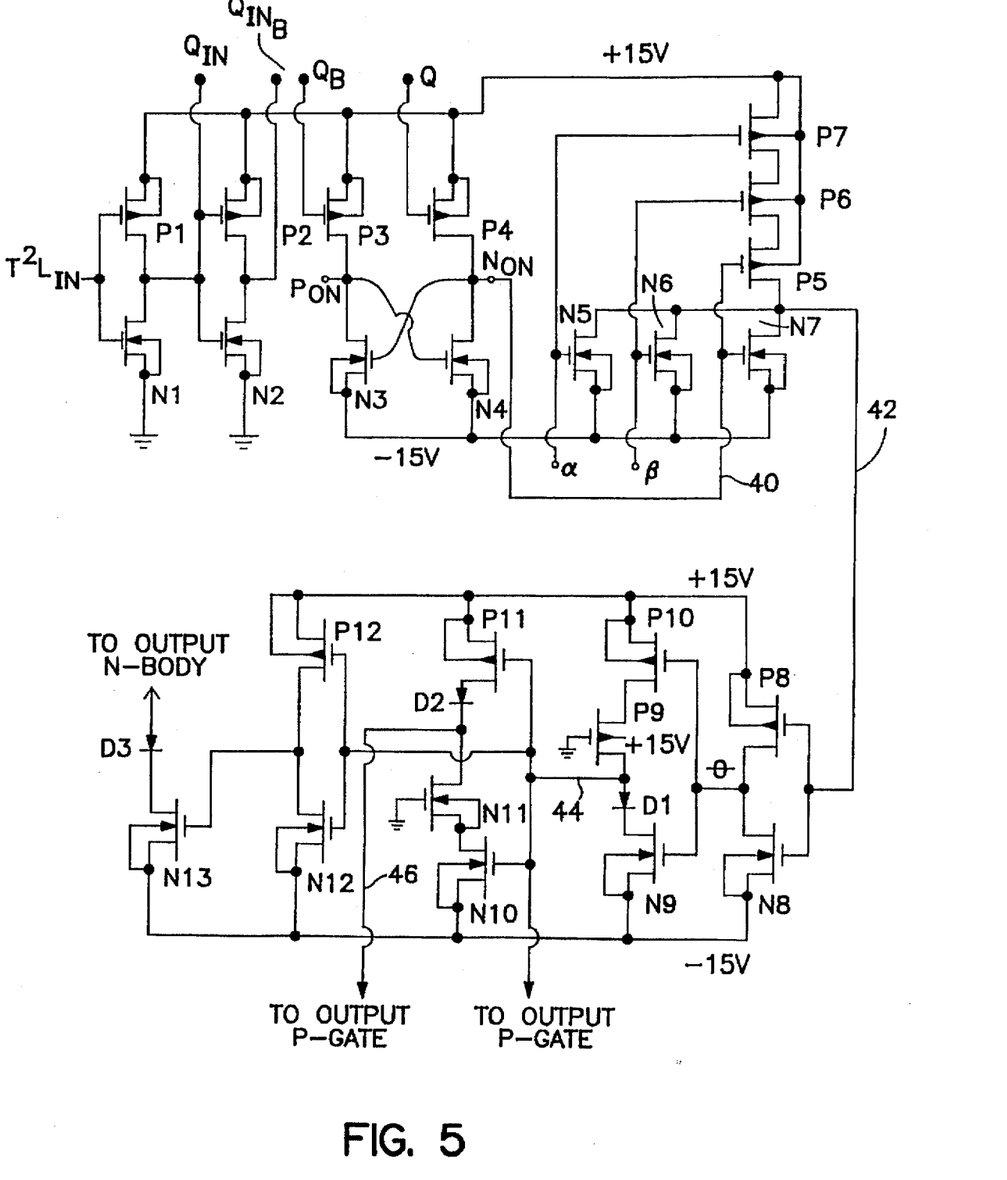
FIG. 5 is a detailed circuit diagram for the driver/translator 20 and the gating circuitry 22 of FIG. 2.

Now referring to FIG. 5, a detailed circuit for the driver/translator 20 and the gating circuitry 22 of FIG. 2 may be seen. In this Figure, as well as FIG. 6 to be described, P-channel devices are identified by the letter "P" followed by a numerical designation identifying the specific device in the circuit. Similarly, N-channel devices are designated by the letter "N" followed by a numerical designation identifying the specific N-channel device in the circuit. As shown in FIG. 5, the T²L input signal is applied to the gates of devices N1 and P1, connected as an inverter, with the output of the inverter connected to the output signal $Q_{in}$ and the gates of devices N2 and P2, also connected as an inverter, which provides the output $Q_{inB}$, the inverse of the output signal $Q_{in}$. The signals $Q_{in}$ and $Q_{inB}$ may be coupled in either order to the inputs Q and $Q_B$ applied to the gates of devices P4 and P3 respectively, the coupling allowing positive or negative logic control by the T²L input signal depending upon which output signal is coupled to which input signal. Alternatively, terminals Q and $Q_B$ may be used as direct complementary CMOS control inputs, if such is to be used, instead of the T²L input control.

Devices P3, P4, N3 and N4 are cross-coupled to operate in a flip-flop like fashion, given the complementary inputs to the gates of devices P3 and P4, to provide the signal $N_{on}$ on line 40 of either a positive voltage approximating the positive power supply voltage or a negative voltage approximating the negative power supply voltage. The signal $P_{on}$, coming from the other leg of the cross coupled circuit, is of opposite state as $N_{on}$. During normal operation, the signals α and β will both be low (the negative power supply voltage), holding devices P6 and P7 on and devices N5 and N6 off. (Hereafter a "high" voltage or state means a voltage substantially equal to the positive power supply voltage, and a "low" voltage or state means a voltage substantially equal to the negative power supply voltage.) Thus, the voltage on line 40 controlling the gates of devices P5 and N7, now acting as an inverter, will determine the voltage on line 42 as either high or low, depending upon whether device P5 or device N7 is on, respectively. The signal on line 42 will follow the signal $P_{on}$, with the signal $N_{on}$ being of opposite state. The signal $P_{on}$ controls devices N21 and P28 (FIG. 6), turning on device N21 and turning off device P28 when high and turning off device N21 and turning on device P28 when low. The signal $N_{on}$ controls devices N18 and P17 (FIG. 6), turning on device N18 and turning off device P17 when high and turning off device N18 and turning on device P17 when low.

Note that in the event that either of the signals α or β go high, one of devices P7 or P6 will turn off, and at the same time one of devices N5 or N6 will turn on, pulling line 42 low, which as shall subsequently be seen, represents the off condition for the switch. The signals α and β are the outputs of the negative and positive side comparators 26, as shown on FIG. 2, and in detail in FIG. 6.

The signal on line 42 is applied to the gates of devices P8 and N8, coupled as an inverter, the output of which is coupled to the gates of devices P10 and N9. These devices, too, are coupled as an inverter, with the exception of the series connection of device P9 and diode D1 between the drains of devices P10 and N9. In operation, when the gates of devices P10 and N9 go low, device P10 turns on and device N9 turns off. This pulls the source of device P9 high, turning the same on to pull line 44 high. When the voltage on the gates of P10 and N9 go high, device N9 turns on and device P10 turns off. This pulls line 44 low through diode D1, though note that because of the presence of the diode, line 44 may be readily driven lower (below the negative power supply voltage, in this case −15 volts) by any other drive coupled to the same line. In that regard, line 44, as shall subsequently be seen, forms the drive voltage for the gate of the N-channel device of the switch.

Line 44 is also coupled to the gates of devices P11 and N10, connected as an inverter, the inclusion of diode D2 and device N11 in series with devices P11 and N10 providing the same function with respect to the positive power supply voltage as diode D1 and device P9 provide with respect to the negative power supply voltage. More specifically, when device P11 is on and device N10 is off, diode D2 will pull line 46, coupled to the gate of the P-channel device in the switch, to a voltage just below the positive power supply voltage. However the presence of the diode D2 will allow any other drive on line 46 to drive the line higher than the positive power supply voltage with ease. Finally, line 44 is also coupled to devices P12 and N12, coupled as an inverter to control device N13 coupled through diode D3 to the N-body of the switch. When line 42 is high (switch on), line 44 will also be high, holding the gate of the N-channel device of the switch (device N14 of FIG. 6) high to hold the same on, and line 46 will be low, holding the gate of the P-channel device of the switch low (device P13 of FIG. 6) to also hold the same on. At the same time, the gate of device N13 will be held low, and thus N13 will be off. However, when line 42 is low, line 44 will be low (and readily driven lower) and line 46 will be high (and readily driven higher), holding the P-channel and the N-channel devices of the switch off in normal operation. This allows the analog output to electrically float, allowing another device to control the same line in many systems.

Figure 6:
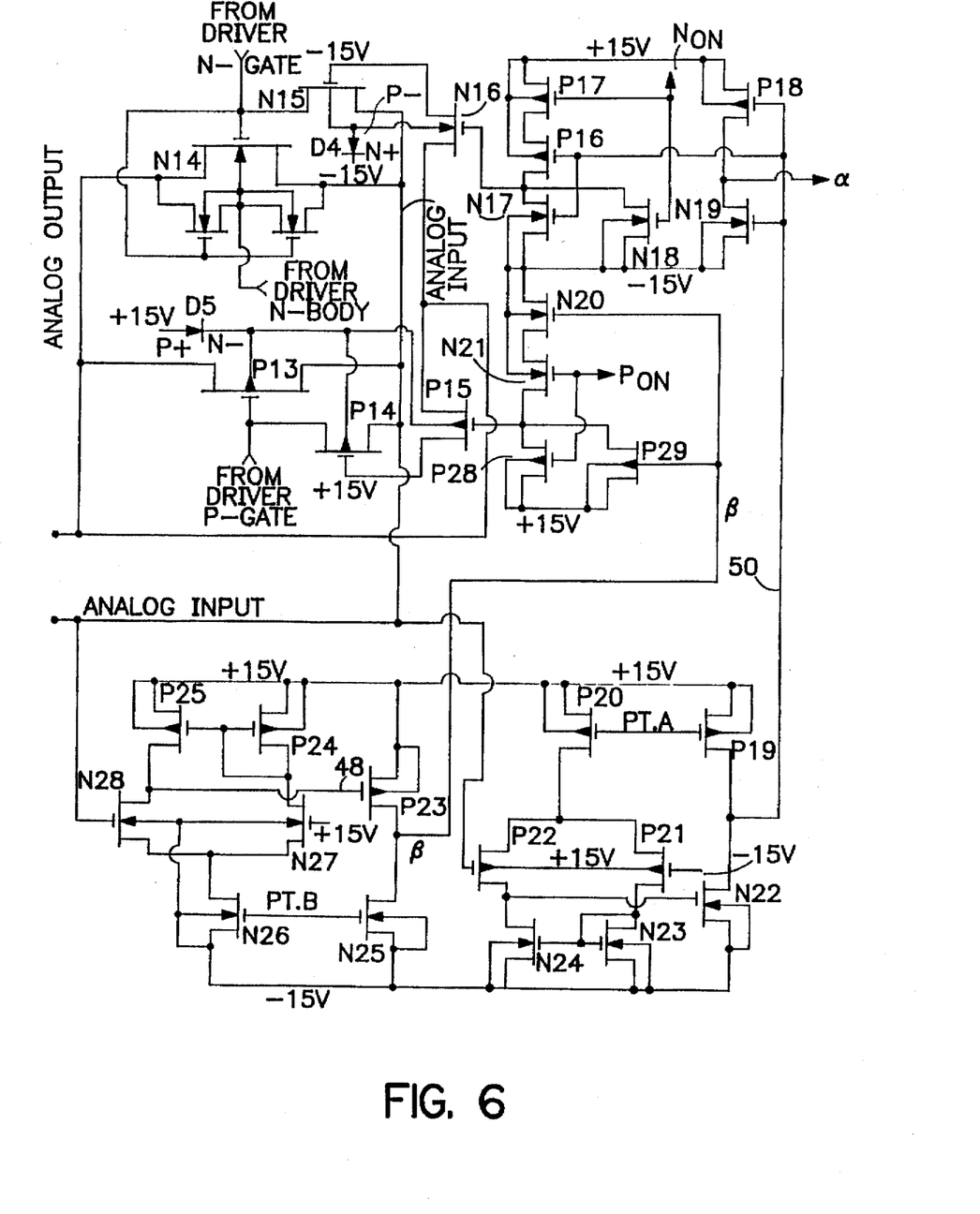
FIG. 6 is a circuit diagram for the actual switch, the clamp circuit, and the circuits for the positive and negative side comparators of the preferred embodiment of the present invention.

Now referring to FIG. 6, the actual switch, the clamp circuit, and the circuits for the positive and negative side comparators may be seen. In the positive side comparator, point B is biased to establish a predetermined (signal level) current through device N26, acting as a current source for the comparator circuit comprised of devices P24, P25, N27 and N28. In particular, the sum of the currents through devices N27 and N28 is equal to the current through device N26. The current through device N27, however, is mirrored by device P24 to device P25. Consequently, with the gate of device N27 coupled to the positive power supply voltage (+15 volts in this example) and the analog input coupled to the gate of device N28, whenever the analog input is less than +15 volts, device N27 will be on and device N28 off, so that current through device N26 is supplied by device N27. This current through device N27 is mirrored by device P24 to device P25. Thus, when the analog input is less than +15 volts, the positive power supply voltage, there will be a higher current through device P25 than device N28, charging line 48 to substantially equal to the positive power supply voltage, thereby holding device P23 off. Because of the current in device N25, the signal β is held low. On the other hand, whenever the analog input exceeds the positive power supply voltage, +15 volts in this example, device N28 will turn on and device N27 will turn off, so that now the current through device N26 is supplied by device N28. The current through device N28, in comparison to the much lower current through device N27 as mirrored by device P24 to device P25, pulls line 48 low, turning on device P23. Since the current through device N25 is limited to a predetermined, relatively low value, the turning on of device P23 will pull the signal β high (substantially to the positive power supply voltage), thereby indicating a fault condition. As previously described, this turns on device N6 and turns off device P6 (see FIG. 5), pulling line 42 low to drive lines 44 and 46 in directions to turn off the two switch devices, N14 and P13, respectively (FIG. 6) as if the T²L input signal was trying to turn off the switch.

The negative side comparator is essentially the inverse of the positive side comparator just described, the circuit in effect being turned over and P-channel devices substituted for N-channel devices and vice-versa. The bias on point A establishes the current through P-channel device P20, supplying the comparison devices P21 and P22 and the current mirror formed by devices N23 and N24 with the required current for the operation thereof. Normally, device P19, also connected as a current source, will pull line 50 to the positive power supply voltage, turning off device P18 and turning on device N19 to hold the signal α low. However, if the analog input goes below the negative power supply voltage, device P21 will turn off, cutting the current through the current mirror of devices N23 and N24 so that the gate of device N22 is pulled high, turning on device N22 and pulling line 50 low. This turns off device N19 and turns on device P18, pulling the signal α high, indicative of the fault condition.

In FIG. 6, devices P14, N15, N14 and P13 correspond to the devices Q1, Q2, Q3 and Q4 respectively, of FIGS. 3a and b and 4a and b. As can be seen in FIG. 6, the analog input is coupled to the sources of devices P14 and N15, with the operation of these four devices being as herein before described with respect to FIGS. 3a and b and 4a and b.

In the specific embodiment disclosed, and as previously described, the signal α goes high if the analog input drops below the negative power supply voltage, and the signal β goes high if the analog input rises above the positive power supply voltage. In normal operation, both α and β are low, and the signal on line 50 is high. Line 50 high holds device P16 off and device N17 on, holding the gate of device N16 low to hold device N16 off so as to not attempt to effect the voltage on the analog output regardless of the state of the signal $N_{on}$. Also β low holds device P29 on and device N20 off, holding the gate of device P15 high to hold device P15 off so as to also not attempt to effect the voltage on the analog output regardless of the state of the signal $P_{on}$.

Now consider the situation when the analog input drops below the negative power supply voltage, driving the signal on line 50 low to drive the signal α high. The low signal on line 50 turns on device P16 and turns off device N17. Now the state of the gate of device N16 will depend on the signal $N_{on}$. If $N_{on}$ is low, corresponding to the switch "on" state, device P17 will be on and device N18 will be off, pulling the gate of device N16 high to turn device N16 on. This ties the analog output to the negative power supply voltage −15 v to clamp the output to the negative power supply voltage in response to the negative analog input overvoltage condition. If $N_{on}$ is high, corresponding to the switch "off" state, device P17 will be off and device P18 will be on, pulling the gate of device N16 low to turn device N16 off so as to not attempt to effect the voltage on the analog output.

If the analog input rises above the positive power supply voltage, β will go high, turning off device P29 and turning on device N20. Now the state of the gate of device P15 will depend on the signal $P_{on}$. If $P_{on}$ is high, corresponding to the switch "on" state, device N21 will be on and device P28 will be off, pulling the gate of device P15 low to turn device P15 on. This ties the analog output to the positive power supply voltage +15 v to clamp the output to the positive power supply voltage in response to the positive analog input overvoltage condition. If on the other hand $P_{on}$ is low, corresponding to the switch "off" state, device P28 will be on and device N21 will be off, pulling the gate of device P15 high to turn P15 off so as to not attempt to effect the voltage on the analog output.

The electrical configuration described to make a fault-proof analog switch will work with virtually any process. However some special steps may be needed, such as for the standard, junction isolated CMOS process. Here, one must isolate the output P-channel (Q4 in FIG. 2, P13 in FIG. 6) and also the disable P-channel Q1 in FIG. 2 and P14 in FIG. 6. This can easily be done by using a double epitaxial process, and placing buried tubs underneath the two P-channels. These buried tubs connect to normal P-well diffusions to effectively isolate the P-channels from the rest of the circuit. The P-well is then taken to −V and the P-channels are junction isolated. Similarly, a single epi process that allows isolated N-channel and P-channel body connections may be used. Similarly, trench isolated processes may also be used.

Thus the present invention provides fault-proof performance that has applicability to, and will dramatically upgrade reliability of, all analog switches. Both users and manufacturers will benefit from this increased reliability. It will save service time to repair damaged p.c. boards, do away with the CMOS sequencing problem described, and improve yields at the manufacturing facility, as normal handling and testing mistakes will not destroy devices.

In the embodiment shown in FIG. 6, a fault is taken as any input voltage which exceeds the positive power supply voltage or is below the negative power supply voltage. Also, upon the occurrence of a fault, the analog output voltage is clamped at the positive power supply voltage if the fault was caused by the analog input voltage exceeding the positive power supply voltage, or alternatively, clamped at the negative power supply voltage if the fault was caused by the analog input voltage falling below the negative power supply voltage. It should be noted, however, that the dividing lines for determining whether a fault condition exists may be voltages other than the power supply voltages. Also, the voltages to which the output is clamped upon the occurrence of a fault condition may also be something other than the power supply voltages. By way of specific example, referring to FIG. 7, it will be noted that the gate of device N27 is coupled to a fault voltage VF+ and the gate of device P21 is coupled to a fault voltage VF−. These voltages, VF+ and VF−, therefore, define the positive and negative voltages above and below which, respectively, the analog input voltage will be considered to be a fault voltage. Obviously VF+ and VF− may be of equal magnitude, though that is not a specific requirement, and can be user selected by bringing these terminals out from the integrated circuit.

Figure 7:
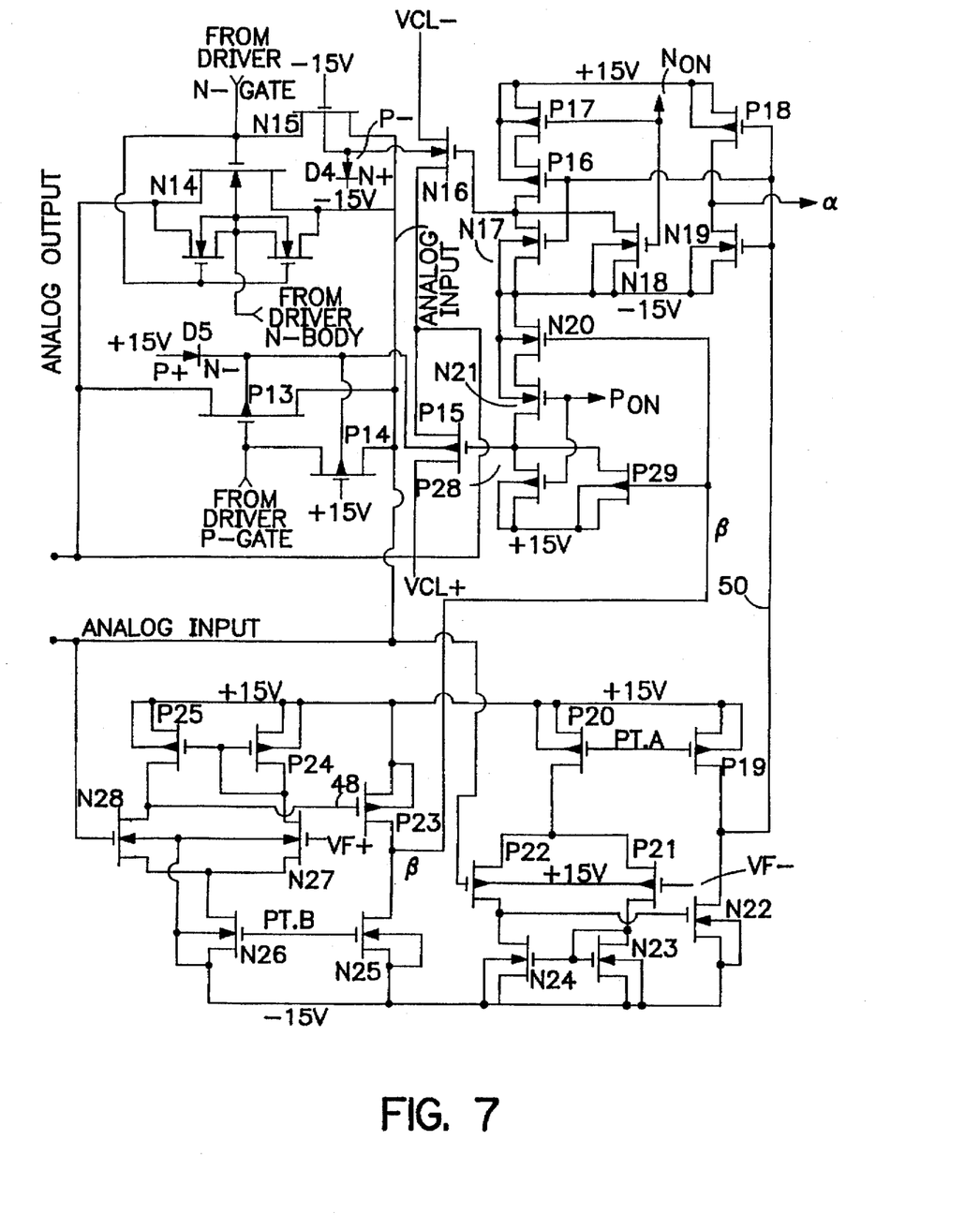
FIG. 7 is a circuit diagram for the actual switch, the clamp circuit, and the circuits for the positive and negative side comparators of an alternate embodiment of the present invention.

Also in the embodiment of FIG. 7, the source of device N16 is shown coupled to a negative clamp voltage VCL− and the drain of device P15 is shown coupled to a positive clamp voltage VCL+. These voltages, VCL+ and VCL−, may also be different from the plus and minus power supply voltages and may be equal or unequal in magnitude, as desired. Here again, bringing these terminals out will allow a user to select the clamp voltages also.

Figure 8:
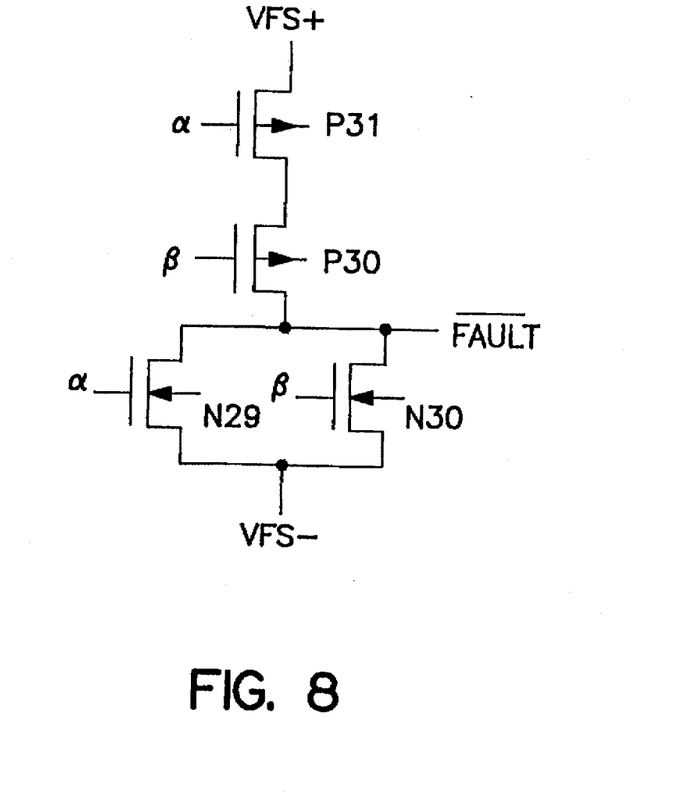
FIG. 8 is a circuit diagram for an additional circuit for embodiments of the present invention such as the embodiments of FIGS. 6 and 7 for providing an output signal indicative of the existence of a fault condition.

Finally, it may be desirable to provide a fault indication signal through another output terminal of the integrated circuit, which signal might be used for such purposes as controlling other parts of a system upon the occurrence of a fault so as to protect the other parts of the system which may not themselves have fault protection as in the present invention. For this purpose, the circuit of FIG. 8 may be used as part of the integrated circuit to sense the existence of a fault condition and provide an output in response thereto. This circuit may be used as part of the integrated circuits of either FIGS. 6 or 7, but is drawn separately for clarity. The circuit is connected to fault signal voltages VFS+ and VFS−, which may be the positive and negative power supplies or any other voltages, the negative fault voltage VFS− being less than the positive fault voltage VFS+. Typically, but not necessarily, standard logic levels would be used. In some applications, it may be desired to make the negative fault voltage VFS− the circuit ground voltage, and the positive fault voltage VFS+ the positive power supply voltage or some lesser positive voltage. In any event, as previously described, when there is no fault condition, both $\alpha$ and $\beta$ are held low by the comparators of FIGS. 2, 6 and 7. Thus, with no fault condition, devices P30 and P31 of FIG. 8 will be on, and devices N29 and N30 will be off, thereby holding the fault signal $\overline{\text{Fault}}$ high (substantially at whatever voltage is the higher fault signal voltage VFS+). However, if either $\alpha$ or $\beta$ goes high, indicative of a fault condition, one of devices P30 and P31 will turn off, and one of devices N29 and N30 will turn on, pulling the fault signal $\overline{\text{Fault}}$ low, (substantially to the lower fault signal voltage VFS−) to signal a fault of either polarity. Using this fault signal output, an output clamp could be outside the integrated circuit rather than incorporated as part of the integrated circuit. Alternatively, or in addition, the signals $\alpha$ and $\beta$ could be brought out from the integrated circuit so that the output clamps responsive to the direction of the fault could be outside the integrated circuit rather than incorporated as part of the integrated circuit.

Finally, the embodiments of the present invention disclosed herein couples the gate of the switch P-channel device to the analog input voltage when the analog input has a voltage above a positive fault voltage, and couples the gate of the switch N-channel device to the analog input voltage when the analog input has a voltage below a negative fault voltage. However the present invention can be realized by instead coupling the gate of the switch P-channel device to a voltage approximately equal to the analog input voltage when the analog input has a voltage above the positive fault voltage, and coupling the gate of the switch N-channel device to a voltage approximately equal to the analog input voltage when the analog input has a voltage below the negative fault voltage.

While the present invention has been disclosed and described with respect to a certain preferred embodiment thereof, it will be understood by those skilled in the art that the present invention may be altered in various ways and realized in various embodiments without departing from the spirit and scope thereof.

We claim:

1. A method of providing fault protection in an analog switch having an analog input and an analog output operating from a first power supply voltage and a second power supply voltage lower than the first power supply voltage, comprising:

a first P-channel device and a first N-channel device, each having a source, a drain and a gate, and having their sources coupled together and their drains coupled together, the method including the steps of:

(a) when the analog input has a voltage between the first and the second power supply voltages;
coupling the gate of the first P-channel device to the second power supply voltage and the gate of the first N-channel device to the first power supply voltage when the switch is commanded on, and
coupling the gate of the first P-channel device to the first power supply voltage and the gate of the first N-channel device to the second power supply voltage when the switch is commanded off (b) when the analog input has a voltage above the first power supply voltage, coupling the gate of the first P-channel device to the analog input voltage, and (c) when the analog input has a voltage below the second power supply voltage, coupling the gate of the first N-channel device to the analog input voltage.

2. The method of claim 1 further comprising the steps of coupling the gate of the first N-channel device to the second power supply voltage when the analog input has a voltage above the first power supply voltage, and coupling the gate of the first P-channel device to the first power supply voltage when the analog input has a voltage below the second power supply voltage.

3. The method of claim 1 wherein the step of coupling the gate of the first P-channel device to the analog input voltage when the analog input has a voltage above the first power supply voltage comprises the step of providing a second P-channel device having a source coupled to the analog input voltage, a drain coupled to the gate of the first P-channel device and a gate coupled to the first power supply voltage.

4. The method of claim 1 wherein the step of coupling the gate of the first N-channel device to the analog input voltage when the analog input has a voltage below the second power supply voltage comprises the step of providing a second N-channel device having a source coupled to the analog input voltage, a drain coupled to the gate of the first N-channel device and a gate coupled to the second power supply voltage.

5. The method of claim 1 further comprising the step of coupling the analog output to the first power supply voltage when the analog input has a voltage above the first power supply voltage.

6. The method of claim 1 further comprising the step of coupling the analog output to the second power supply voltage when the analog input has a voltage below the second power supply voltage.

7. The method of claim 1 further comprising the step of providing a logic signal indicative of either the analog input having a voltage above the first power supply voltage or a voltage below the second power supply voltage.

8. The method of claim 1 further comprising the steps of providing a first signal indicative of the analog input having a voltage above the first power supply voltage, and providing a second signal indicative of the analog input having a voltage below the second power supply voltage.

9. A fault protected analog switch having a first power supply terminal for connecting to a first power supply voltage and a second power supply terminal for connecting to a second power supply voltage less than the first power supply voltage comprising:

a first P-channel device and a first N-channel device, each having a source, a drain and a gate, and having their sources coupled together and to the analog switch input, and their drains coupled together and to the analog switch output;

a second P-channel device and a second N-channel device, each having a source, a drain and a gate;
the source of the second P-channel device being coupled to the analog input, the drain of the second P-channel device being coupled to the gate of the first P-channel device and the gate of the second P-channel device being coupled to the positive power supply terminal; and,
the source of the second N-channel device being coupled to the analog input, the drain of the second N-channel device being coupled to the gate of the first N-channel device and the gate of the second N-channel device being coupled to the negative power supply terminal.

10. The fault protected switch of claim 9 further comprised of circuitry for coupling the gate of the first P-channel device to the second power supply voltage and the gate of the first N-channel device to the first power supply voltage when the switch is commanded on, and when the switch is commanded off, for coupling the gate of the first P-channel device to the first power supply voltage and the gate of the first N-channel device to the second power supply voltage in a manner allowing the gate of the first P-channel device to be driven above the first power supply voltage and the gate of the first N-channel device to be driven below the second power supply voltage.

11. An analog switch comprising:
first and second P-channel devices and first and second N-channel devices, each having a source, a drain and a gate, the sources of all four devices being coupled together and to an analog switch input terminal, the first P-channel device and the first N-channel device having their drains coupled together and to an analog switch output terminal, the second P-channel device and the second N-channel device having their drains coupled to the gates of the first P-channel device and the first N-channel device, respectively, the gates of the second P-channel device and the second N-channel device having their gates coupled to a positive power supply terminal and a negative power supply terminal, respectively.

12. A method of providing fault protection in an analog switch having an analog input and an analog output operating from a first power supply voltage and a second power supply voltage lower than the first power supply voltage, comprising:

a first P-channel device and a first N-channel device, each having a source, a drain and a gate, and having their sources coupled together and their drains coupled together, the method including the steps of:

(a) when the analog input has a voltage between the first and the second fault voltages;
coupling the gate of the first P-channel device to the second power supply voltage and the gate of the first N-channel device to the first power supply voltage when the switch is commanded on, and
coupling the gate of the first P-channel device to the first power supply voltage and the gate of the first N-channel device to the second power supply voltage when the switch is commanded off (b) when the analog input has a voltage above the first fault voltage, coupling the gate of the first P-channel device to a voltage approximately equal to the analog input voltage, and (c) when the analog input has a voltage below the second fault voltage, coupling the gate of the first N-channel device to a voltage approximately equal to the analog input voltage.

13. The method of claim 12 further comprising the steps of coupling the gate of the first N-channel device to the second power supply voltage when the analog input has a voltage above the first fault voltage, and coupling the gate of the first P-channel device to the first power supply voltage when the analog input has a voltage below the second fault voltage.

14. The method of claim 12 wherein the step of coupling the gate of the first P-channel device to a voltage approximately equal to the analog input voltage when the analog input has a voltage above the first fault voltage comprises the step of providing a second P-channel device having a source coupled to the analog input voltage, a drain coupled to the gate of the first P-channel device and a gate coupled to the first power supply voltage.

15. The method of claim 12 wherein the step of coupling the gate of the first N-channel device to a voltage approximately equal to the analog input voltage when the analog input has a voltage below the second fault voltage comprises the step of providing a second N-channel device having a source coupled to the analog input voltage, a drain coupled to the gate of the first N-channel device and a gate coupled to the second power supply voltage.

16. The method of claim 12 further comprising the steps of coupling the analog output to a first clamp voltage when the analog input has a voltage above the first fault voltage.

17. The method of claim 12 further comprising the steps of coupling the analog output to a second clamp voltage when the analog input has a voltage below the second fault voltage.

18. The method of claim 12 further comprising the step of providing a logic signal indicative of either the analog input having a voltage above the first fault voltage or a voltage below the second fault voltage.

19. The method of claim 12 further comprising the steps of providing a first signal indicative of the analog input having a voltage above the first power supply voltage, and providing a second signal indicative of the analog input having a voltage below the second power supply voltage.

20. A fault protected analog switch having a first connection for connecting to a first voltage and a second connection for connecting to a second voltage less than the first voltage comprising:

a first P-channel device and a first N-channel device, each having a source, a drain and a gate, and having their sources coupled together and to the analog switch input, and their drains coupled together and to the analog switch output;

a second P-channel device and a second N-channel device, each having a source, a drain and a gate;

the source of the second P-channel device being coupled to the analog input, the drain of the second P-channel device being coupled to the gate of the first P-channel device and the gate of the second P-channel device being coupled to the first connection; and, the source of the second N-channel device being coupled to the analog input, the drain of the second N-channel device being coupled to the gate of the first N-channel device and the gate of the second N-channel device being coupled to the second connection.

21. The fault protected switch of claim 20 wherein the first connection is a first power supply connection and the second connection is a second power supply connection.

22. The fault protected switch of claim 20 further comprised of circuitry for coupling the gate of the first P-channel device to the second power supply voltage and the gate of the first N-channel device to the first power supply voltage when the switch is commanded on, and when the switch is commanded off, for coupling the gate of the first P-channel device to the first power supply voltage and the gate of the first N-channel device to the second power supply voltage in a manner allowing the gate of the first P-channel device to be driven above the voltage on the first connection and the gate of the first N-channel device to be driven below the voltage on the second connection.

23. An analog switch comprising:

first and second P-channel devices and first and second N-channel devices, each having a source, a drain and a gate, the sources of all four devices being coupled together and to an analog switch input terminal, the first P-channel device and the first N-channel device having their drains coupled together and to an analog switch output terminal, the second P-channel device and the second N-channel device having their drains coupled to the gates of the first P-channel device and the first N-channel device, respectively, the gates of the second P-channel device and the second N-channel device having their gates coupled to a first terminal for connection to a first voltage and a second terminal for connection to a second voltage less than the first voltage, respectively.

* * * * *

UNITED STATES PATENT AND TRADEMARK OFFICE
CERTIFICATE OF CORRECTION

PATENT NO. : 5,666,082
DATED : September 9, 1997
INVENTOR(S) : Wilenken et al.

It is certified that error appears in the above-identified patent and that said Letters Patent is hereby corrected as shown below:

In the title page, item [56] References Cited, please insert --

| | | |
|---|---|---|
| 4,001,606 | 1/1977 | Dingwall |
| 4,691,129 | 9/1987 | Einzinger et al. |

FOREIGN PATENT DOCUMENTS

| | | |
|---|---|---|
| JP55157192 | 6/1980 | Japan |
| JP63132524 | 4/1988 | Japan --. |

Signed and Sealed this

Sixth Day of January, 1998

Attest:

BRUCE LEHMAN

*Attesting Officer*    *Commissioner of Patents and Trademarks*